United States Patent [19]

Davis et al.

[11] Patent Number: 5,198,718
[45] Date of Patent: Mar. 30, 1993

[54] FILAMENTLESS ION SOURCE FOR THIN FILM PROCESSING AND SURFACE MODIFICATION

[75] Inventors: Mervyn H. Davis, Chichester; Gary Proudfoot, Wantage; Keith H. Bayliss, Abingdon, all of United Kingdom

[73] Assignee: Nordiko Limited, United Kingdom
[21] Appl. No.: 602,254
[22] PCT Filed: Mar. 6, 1990
[86] PCT No.: PCT/GB90/00340
§ 371 Date: May 31, 1991
§ 102(e) Date: May 31, 1991
[87] PCT Pub. No.: WO90/10945
PCT Pub. Date: Sep. 20, 1990

[30] Foreign Application Priority Data

Mar. 6, 1989 [GB] United Kingdom ............... 8905073

[51] Int. Cl.$^5$ ............................................. H01J 27/16
[52] U.S. Cl. ........................... 313/359.1; 313/360.1; 313/361.1; 313/362.1; 313/363.1; 313/230; 250/423 R; 315/111.41
[58] Field of Search ............... 313/230, 231.41, 359.1, 313/360.1, 362.1, 363.1; 315/111.41, 111.51, 111.61; 250/423 R; 204/192.11, 192.34, 298.04, 298.36

[56] References Cited

U.S. PATENT DOCUMENTS

| | | | |
|---|---|---|---|
| 4,507,588 | 3/1985 | Asmussen et al. | 315/39 |
| 4,713,585 | 12/1987 | Ohno et al. | 313/359.1 |
| 4,767,931 | 8/1988 | Sato et al. | 204/298.04 |
| 4,851,668 | 7/1989 | Ohno et al. | 250/251 |

FOREIGN PATENT DOCUMENTS

| | | |
|---|---|---|
| 0200651 | 4/1986 | European Pat. Off. |
| 1138853 | 2/1985 | U.S.S.R. |
| 2162365 | 1/1986 | United Kingdom |
| 2180686 | 4/1987 | United Kingdom |

OTHER PUBLICATIONS

Kaufman et al., "Technology and applications of broad-beam ion sources used in sputtering. Part I. Ion source Technology," J. Vac. Sci. Technol., 21(3), Sep.-/Oct. 1982, pp. 725-736.
Harper et al., "Technology and applications of broad-beam ion sources used in sputtering. Part II. Applications," J. Vac. Sci. Technol., 21(3), Sep./Oct. 1982, pp. 737-755.
Kaufman et al., "Developments in broad-beam, ion-source technology and applications," J. Vac. Sci. Technol., 21(3), Sep./Oct. 1982, pp. 764-767.
Kaufman, "Broad-beam ion source: Present status and future directions," J. Vac. Sci. Technol., A4(3), May/-Jun. 1986, pp. 764-771.
Lejeune et al., "Rf multipolar plasma for broad and reactive ion beams," Vacuum, vol. 36, Nos. 11/12, pp. 837-840 (1986).
Lossy et al., "Rf broad-beam ion source for reactive sputtering," Vacuum, vol. 36, Nos. 11/12, pp. 973-976 (1986).
Lossy et al., "Characterization of a reactive broad beam ratio-frequency ion source," J. Vac. Sci. Technol., B6(1), Jan./Feb. 1988, pp. 284-287.
Lejeune et al., "Electrostatic reflex plasma source as a plasma bridge neutralizer," Vacuum, vol. 36, Nos. 11/12, pp. 857-860 (1986).

Primary Examiner—Donald J. Yusko
Assistant Examiner—N. D. Patel
Attorney, Agent, or Firm—Scully, Scott, Murphy & Presser

[57] ABSTRACT

A filamentless (without a heated cathode) ion source for thin film processing and surface modification. The ion source comprises a plasma chamber which includes a wall defining an evacuable chamber having a first end and a second end, with a dielectric member extending across the first end of the evacuable chamber. A gas inlet admits a plasma forming gas into the chamber. An RF emitter is positioned adjacent to the dielectric member for inductively generating a plasma in the gas in the plasma chamber during use of the ion source. A control grid structure is provided for extracting ions from plasma in the plasma chamber, and include a first grid connected to a positive voltage source and a second grid connected to a negative voltage source, to produce an acceleration field for accelerating ions towards and through the second grid of the control grid structure. An ion beam processing apparatus and an ion beam neutralizer incorporating such an ion source are also described.

28 Claims, 11 Drawing Sheets

FILAMENTLESS ION SOURCE FOR THIN FILM PROCESSING AND SURFACE MODIFICATION

BACKGROUND OF THE INVENTION

This invention relates to an ion gun for use in an ion beam processing apparatus, to an ion beam processing apparatus incorporating same and to an ion beam neutraliser.

There have been various proposals in the prior art to use broad beam ion sources for surface modification of substrates, either by sputter deposition, sputter etching or milling. Such broad beam ion sources utilise multiaperture ion optics and typically range in diameter from about 25 mm up to about 500 mm.

In a typical ion beam source (or ion gun) a plasma is produced by admitting a gas or vapour to a low pressure discharge chamber containing a heated cathode and an anode which serves to remove electrons from the plasma and to give a surplus of positively charged ions which pass through a screen grid or grids into a target chamber which is pumped to a lower pressure than the discharge chamber. Ions are formed in the discharge chamber by electron impact ionisation and move within the body of the ion gun by random thermal motion. The plasma will thus exhibit positive plasma potential which is higher than the potential of any surface with which it comes into contact. Various arrangements of grids can be used, the potentials of which are individually controlled. In a multigrid system the first grid encountered by the ions is usually positively biased whilst the second grid is negatively biased. A further grid may be used to decelerate the ions emerging from the ion source so as to provide a collimated beam of ions having more or less uniform energy. Ion guns displaying high current operation and delivering ion energies in the range up to about 1500 volts, as a generic type find wide use in thin film technology. For ion sputtering a target is placed in the target chamber where this can be struck by the beam of ions, usually at an oblique angle, and the substrate on to which material is to be sputtered is placed in a position where sputtered material can impinge on it. When sputter etching or milling is to be practised the substrate is placed in the path of the ion beam.

Hence, in a typical ion gun an ion arriving at a multiaperture extraction grid assembly first meets a positively biased grid. Associated with the grid is a plasma sheath. Across this sheath is dropped the potential difference between the plasma and the grid. This accelerating potential will attract ions in the sheath region to the first grid. Any ion moving through an aperture in this first grid, and entering the space between the first, positively biased grid, and the second, negatively biased, grid is strongly accelerated in the intense electrical field. As the ion passes through the aperture in the second grid and is in flight to the earthed target it is moving through a decelerating field. The ion then arrives at an earthed target with an energy equal to the voltage of the first, positive, grid plus the sheath potential.

Although such prior art ion beam sources operate satisfactorily with inert gases the life of the cathode is severely limited if a reactive gas, such as oxygen, fluorine or chlorine, is added to or replaces the inert gas used to generate the plasma. For this reason it is unsatisfactory to use such ion beam sources with reactive gases.

A review of broad beam ion sources has appeared, viz: "Technology and applications of broad-beam ion sources used in sputtering. Part I. Ion Source technology" by H.R. Kaufman, J.J. Cuomo, and J.M.E. Harper, J. Vac. Sci. Technol, 21(3), Sept./Oct. 1982, pages 725 to 736. The second part of this review, viz: "Part II. Applications" by J.M.E. Harper, J.J. Cuomo, and H.R. Kaufman appeared in the same journal, immediately following Part I thereof, at pages 737 to 755. The same authors published a further paper "Developments in broad-beam, ion-source technology and applications" in the same issue of the same journal at pages 764 to 767. A more recent report from Harold R. Kaufman appeared under the title "Broad-beam ion sources Present status and further directions", J. Vac. Sci Technol A 4(3), May/June 1986 at pages 764 to 771.

The use of a capacitively coupled rf discharge plasma for generation of ion beams has been proposed by C. Lejeune et al in a paper "Rf multipolar plasma for broad and reactive ion beams", Vacuum, Vol. 36, Nos. 11/12 (1986), pages 837 to 840 and in EP-A-0200651.

Another form of r.f. broad beam ion source with magnetic confinement, using a multipole arrangement with magnets arranged with alternate north and south poles facing tne plasma, has been described by R. Lossy and J. Engemann in papers entitled "Rf-broad-beam ion source for reactive sputtering", Vacuum, 36, Nos. 11/12, pages 973 to 976 (1986) and "Characterization of a reactive broad beam radio frequency ion source", J. Vac. Sci. Technol. B6(1), Jan/Feb 1988, pages 284 to 287.

Plasma generation by means of r.f. excitation relies upon the ability of electrons to respond to the high frequency field and the inability of ions to do so because of their relatively high inertia. As a result electrons are stripped off the gas molecules. The electrons then become trapped by the magnetic confinement cusps formed by the alternately north and south poles which face the plasma, leaving a positively charged plasma in the central part of the plasma generation chamber Because prior art designs involving r.f. capacitive excitation produce high plasma potentials of the order 200 V to 300 V the ions are accelerated very fast towards the first grid and hit this with high energy thereby heating it and tending to cause sputtering of grid material which in turn can give rise to contamination in the extracted ion beam.

Another design of ion beam source in which an inductively coupled r.f. power source is used to excite a gaseous material to a plasma state and to produce atomic ions rather than molecular ions is described in GB-A-2162365. In this design a quartz chamber in the shape of a bell jar is surrounded by a coil which is connected both to a radio frequency power source and also to a second power source which is isolated by means of coils from the radio frequency power source and which is adapted to provide a steady solenoidal magnetic field in the region of the major part of the wall of the chamber. A metal plate closes the otherwise open end of the bell jar except for an exit hole for ions produced by the source and acts as an extraction electrode. In use the wall of the chamber can reach a temperature of about 600° C. Although this ion source operates reasonably satisfactorily at frequencies of about 2 MHz, it is not practicable to operate at higher, more commercially desirable frequencies, such as 13.56 MHz or a multiple thereof.

Another form of ion source with a solenoidal coil surrounding the chamber in which a plasma is to be generated is described in GB-A-2180686.

Although extracted ion beams from all ion sources are naturally space-charge neutralised, current neutralisation at an insulating target is not, however, ensured. Hence in ion beam processing it is desirable to provide a surplus of moderately accelerated electrons, apart from the thermal electrons that will always be present so as to provide the necessary electron flux to an insulated target to afford current neutralisation. In this way the development of a charge on the target or substrate is avoided. A number of designs of neutraliser have been proposed. A typical neutraliser uses a hollow cathode discharge, fed either with mercury vapour (for space propulsion applications) or with argon (for other applications), to form a plasma bridge that acts as an electron source. This plasma bridge effuses out of the hollow cathode through a small diameter aperture bored in a hot tungsten tip that typically operates at about 1000° C. Another design of neutraliser, that also uses a hot cathode to generate a plasma with argon as the plasma forming gas, has been proposed in a paper entitled "Electrostatic reflex plasma source as a plasma bridge neutralizer" by C. Lejeune, J.P. Grandchamp and O. Kessi, Vacuum, Volume 36, Nos. 11/12, pages 857 to 860 (1986). Further description of the use of neutralisers will be found in the other papers cited above.

A drawback to use of the conventional designs of neutraliser is that, as they employ hot cathodes to generate a plasma, it is necessary to utilise an inert gas or vapour from which to generate the plasma. For certain applications involving use of a reactive gas the introduction of an inert plasma forming gas, such as argon, may be disadvantageous. However, if a neutraliser with a hot cathode is supplied with a reactive gas, this will soon result in destruction of the cathode.

In the r.f. excited ion guns of the prior art a plasma is generated in the magnetic confinement chamber. For optimum operation of the ion gun it is important that the plasma from which the ions are accelerated shall be of high density, as uniform as possible, and at as low a potential as possible. However, these aims cannot be satisfactorily met with the prior art designs.

SUMMARY OF THE INVENTION

It would be desirable to provide an ion gun in which the plasma from which the ions are accelerated by the accelerator grid is at a low potential of not more than about 500 V and is of uniform density so as to permit high current densities of the order 2 to 5 mA/cm$^2$ in the ion beam to be achieved at low potential (i.e. less than about 500 V) with minimum risk of damage to the accelerator grid in operation.

It would further be desirable to provide an ion gun in which the plasma can be efficiently generated using a commercially acceptable high radio frequency, such as 13.56 MHz or a multiple thereof, and in which the resulting plasma has the desirable properties of high density, good uniformity and a relatively low plasma potential.

It would further be desirable to provide an ion beam neutraliser which does not utilise a hot cathode to generate a plasma and hence can be supplied with a reactive gas.

The present invention accordingly seeks to provide an ion gun which is capable of operation in a manner such that the above aims are substantially achieved.

The invention further seeks to provide a novel design of ion beam neutraliser which can be safely utilised with reactive gases.

According to the present invention there is provided an ion gun for use in ion beam processing comprising:
 (a) a plasma chamber comprising:
   wall means defining an evacuable chamber having a first end and a second end; and
   a dielectric member which extends across the first end of the evacuable chamber;
 (b) gas inlet means for admission to the chamber of a plasma forming gas;
 (c) r.f. emitter means associated with the dielectric member for inductively generating a plasma in the gas in the plasma chamber in use of the ion gun; and
 (d) a control grid structure for extracting ions from plasma in the plasma chamber including a first grid arranged for connection to a positive voltage source and a second grid arranged for connection to a negative voltage source so as to produce an acceleration field for accelerating ions towards and through the second grid of the control grid structure.

The invention further provides an ion beam processing apparatus comprising
 (1) a vacuum chamber;
 (2) an ion gun arranged to project an ion beam into the vacuum chamber;
 (3) an ion beam neutraliser for projecting electrons into the ion beam; and
 (4) a support for a target or a substrate in the path of the ion beam; the ion gun comprising:
  (a) a plasma chamber comprising:
    wall means defining an evacuable chamber having a first end and a second end; and
    a dielectric member which extends across the first end of the evacuable chamber;
  (b) gas inlet means for admission to the plasma chamber of a plasma forming gas;
  (c) r.f. emitter means associated with the dielectric member for inductively generating a plasma in the gas in the plasma chamber in use of the ion gun; and
  (d) a control grid structure for extracting ions from plasma in the plasma chamber including a first grid arranged for connection to a positive voltage source and a second grid arranged for connection to a negative voltage source so as to produce an acceleration field for accelerating ions towards and through the second grid of the control grid structure.

In the ion gun of the present invention, inductive r.f. coupling is used to generate a plasma in the plasma chamber. The resulting plasma typically exhibits a plasma potential that is no more than a few tens of volts above the potential of the plasma chamber or of the highest potential of the internal surface thereof. This is in contrast to many of the prior art designs of ion gun which utilise capacitative r.f. coupling to generate the plasma and which form a plasma with a plasma potential of some hundreds of volts.

The wall means may be constructed from an electrically conductive material. However, if it is desired, for example, to avoid any possibility of contamination of the ion beam by metallic ion contaminants, then the wall means may be constructed from a dielectric material.

The ion gun may further include primary magnet means for trapping electrons adjacent the wall of the plasma chamber in use of the ion gun. Such primary magnet means may comprise an array of magnets arranged to produce lines of magnetic flux within the plasma chamber which extend in a curve from the wall of the plasma chamber and return thereto so as to form an arch over a respective one of a plurality of wall regions of said plasma chamber, for example, wall regions which extend substantially longitudinally of the wall of the plasma chamber. Rare earth magnets are preferably used.

In one arrangement said primary magnet means comprises an even number of magnets arranged in an array including at least one row extending around the periphery of said plasma chamber, each magnet in said array being disposed with its magnetic axis extending substantially in a lateral plane and having a pole of opposite polarity to that of the magnets adjacent to it facing towards the plasma chamber. There may be a single row of bar magnets whose longest dimension is disposed substantially longitudinally with respect to the plasma chamber and preferably substantially parallel to the chamber axis and whose magnetic axis is aligned with the shortest dimension of the magnet. Such an arrangement will produce magnetic fields within the plasma chamber wherein the lines of magnetic flux form arches from a north pole of one magnet to a south pole of an adjacent magnet and so on, each arch extending over a corresponding longitudinal wall portion of the plasma chamber extending substantially parallel to the chamber axis.

In another arrangement the array of magnets comprises a plurality of rows of magnets extending around the periphery of said plasma chamber with each magnet in a row having a pole of opposite polarity to that of any adjacent magnet in another adjacent row facing towards the plasma chamber. Such an arrangement can be envisaged as similar to a checkerboard with alternating black and white squares being replaced by alternating north and south poles. In a typical arrangement of this type there may be, for example, from about 3 to about 15 rows of magnets, preferably from about 5 to about 10 rows of magnets.

The number of primary magnets in the array will normally be an even number. Hence there will usually be an even number of magnets in the row or, if there is more than one row, in each row. Typically the row, or each row, contains from about 10 to about 60 magnets. The number of magnets will normally be chosen in dependence upon the size of the plasma chamber. A small plasma chamber will normally be associated with a smaller number of primary magnets than a large plasma chamber.

Although it is possible to use a concave or dished dielectric member to extend across the said one end of the plasma chamber so that there is a cavity formed by the dielectric member at that end of the plasma chamber, it is preferred to use as near flat a dielectric member as possible. Hence minimal dishing of the dielectric member is preferred. However, it may not be practical to avoid all dishing of the dielectric member as it must be ensured that the integrity of the vacuum equipment be preserved and that all risk of fracture of the dielectric member due to pressure differences exerted across it during operation is substantially obviated.

Preferably the r.f. emitter means associated with the dielectric member comprises a coil which lies adjacent to, or is embedded within, the dielectric member. Hence the coil is preferably flat or as near flat as is practicable. Such a coil may take the form of a tube of conductive material, e.g. copper, through which a coolant, such as water, can be passed. Preferably it comprises a spirally wound coil.

With this preferred configuration it is possible to utilise efficiently relatively high frequency r.f. signals, e.g. signals of 13.56 MHz. Optimisation of the plasma density within the plasma chamber, when the plasma is generated within a radio frequency inductively driven plasma chamber, is a function of power supply frequency and the design of energising coil used. With the preferred substantially flat spirally wound emitter coil the advantages are:

1. The inductance associated with the plasma loop current of ionising electrons can be kept reasonably low. This prevents the induced electric field from reaching values where the energy gained by the electrons between gas collisions would be such as to take their ionisation cross section well past its optimum.
2. Losses to the walls are minimised.
3. High energy ionising electrons spiralling out of the plasma loop are contained in the electrode structure. This effect can be further enhanced by a superimposed magnetic dipole field which penetrates the energising coil.
4. There is an electrodynanic force which tends to push the whole plasma loop current down towards the ion extraction grids.
5. The Q factor of the drive coil is reasonably high which in turn means a high power efficiency.

Typically the r.f. emitter means associated with the dielectric member is arranged to be connected to an r.f. power source which operates at a frequency in the range of from about 1 MHz up to about 45 MHz, e.g. at about 2 MHz or, more preferably, at one of the industrially allotted wavebands within this range of frequencies, e.g. at 13.56 MHz or 27.12 MHz or 40.68 MHz.

At the ion densities required for adequate extracted beam current density the bulk plasma behaves as a good conductor and hence has a low skin depth to r.f. electromagnetic fields. This means for inductive coupling that the induced currents flow in circuits which are largely on the plasma surface and close to the driving coil. The impedance which the plasma presents to the induced currents may be shown to be a series combination of inductance and resistance, and therefore the plasma loop driving potential, i.e. the line integral of the induced electric field, is the sum of two vectors at 90° to each other in the time domain. Primary ionising electrons within the plasma skin depth are accelerated by this field and ideally the average energy gained should be such as to take the electrons ionising cross section, which is a function of their energy, to its maximum value. If the induced electric field is too large, as a result of adverse geometry etc, electrons gain so much energy before collision that their cross section falls to a low value and low ionisation results almost regardless of power input. A correct balance is required between the resistive and inductive components of the electric field for the particular conditions of operation, hence the inductive component must not be too large. At 13.56 MHz using a solenoidal energising coil the plasma inductive reactance is getting too high but for a relatively small spiral coil the plasma reactance is smaller.

The flat spiral coil has further advantages in that it allows the total surface area exposed to plasma to be considerably reduced and this reduces the loss of electrons to the plasma chamber walls.

It may further be shown that the overall power efficiency of the coupling transformer, which is formed with the driving coil as primary and the plasma circuit as secondary is given by $$E = \frac{k^2 Qp}{k^2 Qp + Qs + 1/Qs}$$

where k is the coefficient of coupling and the Q terms represent the quality factors of the primary and secondary circuits, e.g. $Qp = wLp/\sqrt{p}$ the ratio of coil inductive reactance to its resistance. Maximum efficiency is achieved for arbitrary plasma condition when $k^2 Qp$ is as high as possible; k is maximised by placing the coil as close to the plasma as other restrictions will allow and then the driving coils Qp must not fall to values so low as to produce thermal "runaway". This can occur if a coil is not optimally wound or is not water cooled, whereby, as a result of the positive temperature coefficient of copper, a rise in the coil's temperature produces a rise in its a.c. resistance ($\sqrt{p}$) and hence a further rise in temperature. The efficiency of the driving transformer then falls since Qp falls with increasing $\sqrt{p}$ and most of the power supplied goes to heating the coil instead of energising the plasma. Simple coil structures always yield the greatest Q values and the spiral is no exception although it may have a lower Q than a large solenoid.

Other advantages of the spiral coil when compared to a solenoid are, firstly, that the electrodynamic forces exerted on the plasma by the currents flowing in the driving coil tend to push the plasma towards the beam extraction grids, and that, assuming the plasma chamber is larger than the coil, high energy electrons spiralling out of the plasma current loop are better retained within the system.

By appropriate choice of geometry for the spiral driving coil and by modifying the magnetic field strength and/or distribution within the plasma chamber it is possible to tune the excitation of the discharge for a variety of gases, e.g. Ar, $O_2$ or $N_2$.

In a preferred form an ion gun according to the invention further includes secondary magnet means associated with the r.f. emitter means for producing a magnetic dipole field that penetrates the r.f. energising coil or other form of r.f. emitter means.

It is also possible to provide a further magnet means hereinafter called a tertiary magnet means, for superimposing a longer range axial field on top of the field produced by the multipolar array of said primary magnet means. Such a tertiary magnet means can, for example, take the form of an electromagnet surrounding the plasma chamber whose axis is arranged to be substantially aligned with or parallel to that of the plasma chamber.

In an ion beam apparatus according to the invention it is preferred to utilise an ion beam neutraliser that is powered by an r.f. energy source to produce a beam of electrons that can be projected into the ion beam. Conveniently such an r.f. energy source operates at the same frequency as that of the r.f. generator means of the ion gun.

The invention thus further provides an ion beam neutraliser comprising an open ended plasma source chamber having walls of dielectric material, means for admitting a plasma forming gas to the plasma source chamber, an r.f. generating coil surrounding the plasma source chamber for generating a plasma therein, and an extraction grid structure across the open end of the plasma source chamber including a first grid arranged for connection to a negative voltage source and a second grid arranged for connection to a positive voltage source so as to produce an acceleration field for accelerating electrons towards and through the second grid of the extraction grid structure. Such an ion beam neutraliser may use an inert gas, a reactive gas or a mixture of an inert gas and a reactive gas, as plasma forming gas.

BRIEF DESCRIPTION OF THE DRAWINGS

In order that the invention may be clearly understood and readily carried into effect, some preferred forms of ion beam processing apparatus will now be described, by way of example only, with reference to the accompanying semi-diagrammatic drawings, in which.

DETAILED DESCRIPTION OF THE DRAWINGS

Figure 1:
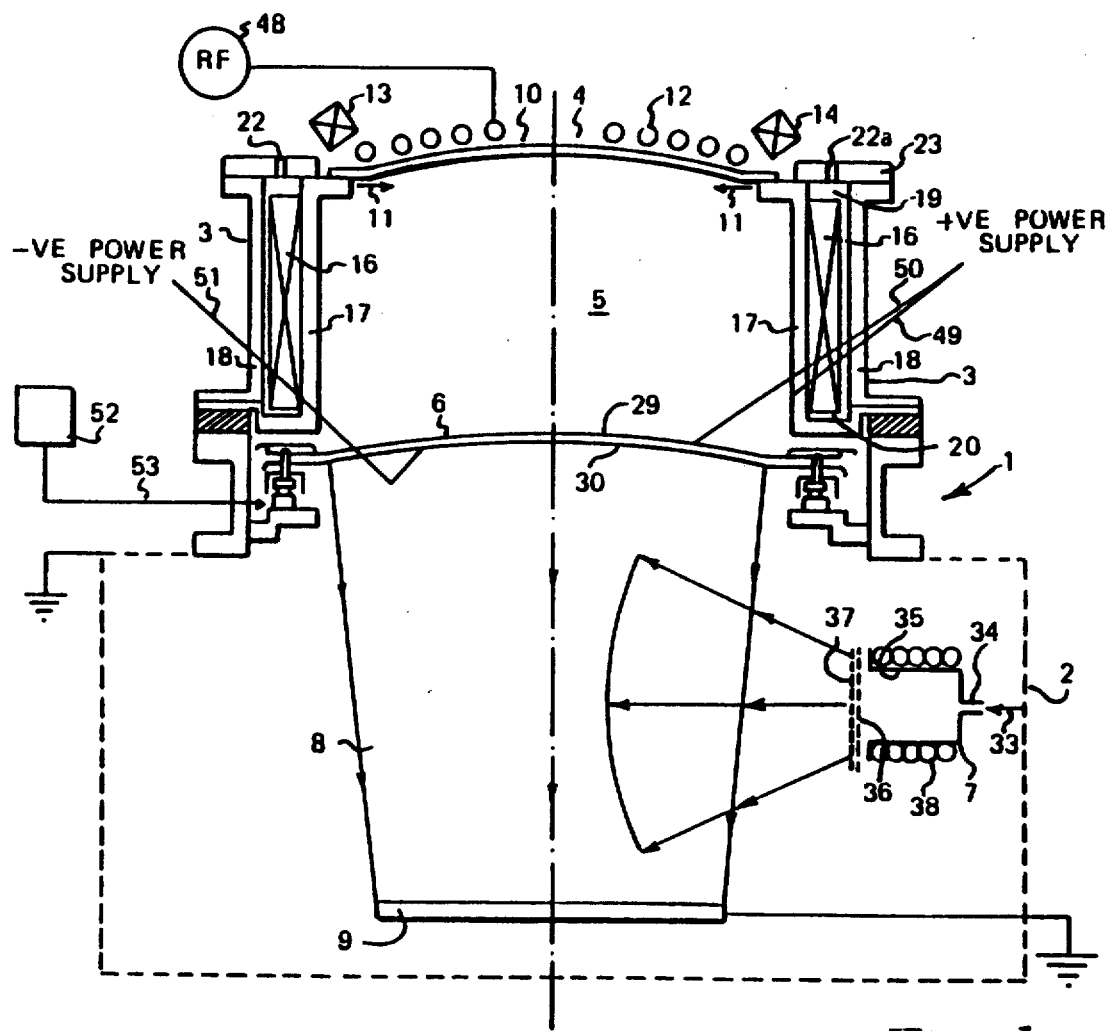
FIG. 1 is a vertical section through an ion beam processing apparatus.

Referring to FIGS. 1 to 7 of the drawings, an ion beam processing apparatus 1 comprises a vacuum chamber (indicated diagrammatically at 2) surmounted by an ion gun 3. Ion gun 3 comprises a plasma generator 4 mounted on top of an open ended plasma chamber 5, the lower end of which is closed by a control grid structure 6. A plasma neutraliser 7 is mounted within vacuum chamber 2 for neutralising the ion beam 8 which issues from the lower end of ion gun 3. A target 9 is placed in the path of the ion beam 8.

Plasma generator 4 comprises a dielectric member 10 which closes the top open end of plasma chamber 5. A number of gas inlet nozzles are provided, as indicated by arrows 11, through which a plasma forming gas, such as argon, or a mixture of a plasma forming gas and a reactive gas, such as oxygen, can be admitted to the plasma chamber 5. An r.f. coil 12 surmounts member 10 and is connected to a suitable r.f. power source operating at, for example 13.56 MHz. Magnets 13 and 14 are provided for a purpose which will be further described below.

Plasma chamber 5 comprises an open-ended metallic body 15, made of aluminium or of an aluminium alloy or another conductive non-magnetic material, within which are mounted a plurality of primary bar magnets 16. For ease of assembly body 15 is made in two parts, i.e. an inner part 17 and an outer part 18, between which the primary magnets 16 are positioned.

Figure 3:
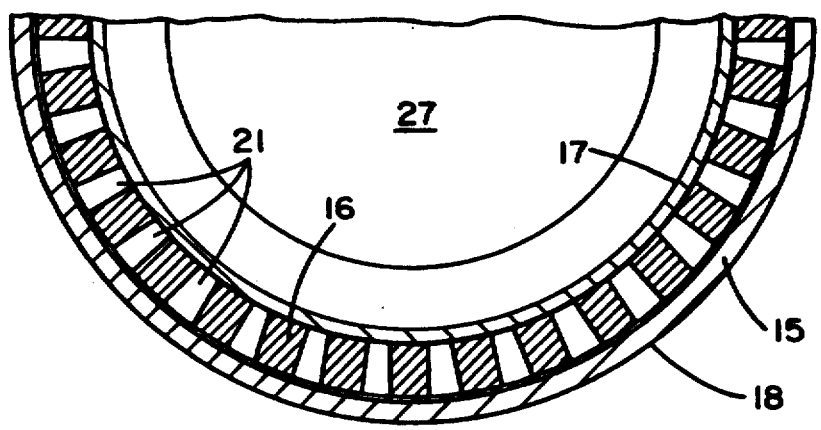
FIG. 3 is a partial horizontal section through the plasma chamber of the apparatus of FIGS. 1 and 2.

As can be seen from FIG. 3, there are thirty-two primary bar magnets 16 secured longitudinally to the cylindrical outer face of inner part 17. Preferably the strongest available magnets, e.g. rare earth magnets such as samarium-cobalt magnets, are used. Typically such magnets exhibit a field strength of the order of 1 to 2 kGauss. As illustrated in FIG. 3 there are thirty-two primary magnets 16. However, a larger or smaller number of primary magnets, for example thirty or less (e.g. twenty-four) or up to forty or more (e.g. forty-eight), may be used, provided always that there is an even number of primary magnets 16. Such primary magnets 16 are evenly spaced around the outer periphery of inner part 17 with their longest dimension arranged substantially parallel to the axis of the plasma chamber 5. As indicated in FIG. 4, however, the magnetic axes of primary magnets 16 are arranged radially with respect to plasma chamber 5 so that their respective north and south poles (indicated as N and S respectively in FIG. 4) are separated in the direction of their shortest dimension, the primary magnets 16 being arranged with alternating magnetic polarity around the periphery of inner part 17.

Figure 5:
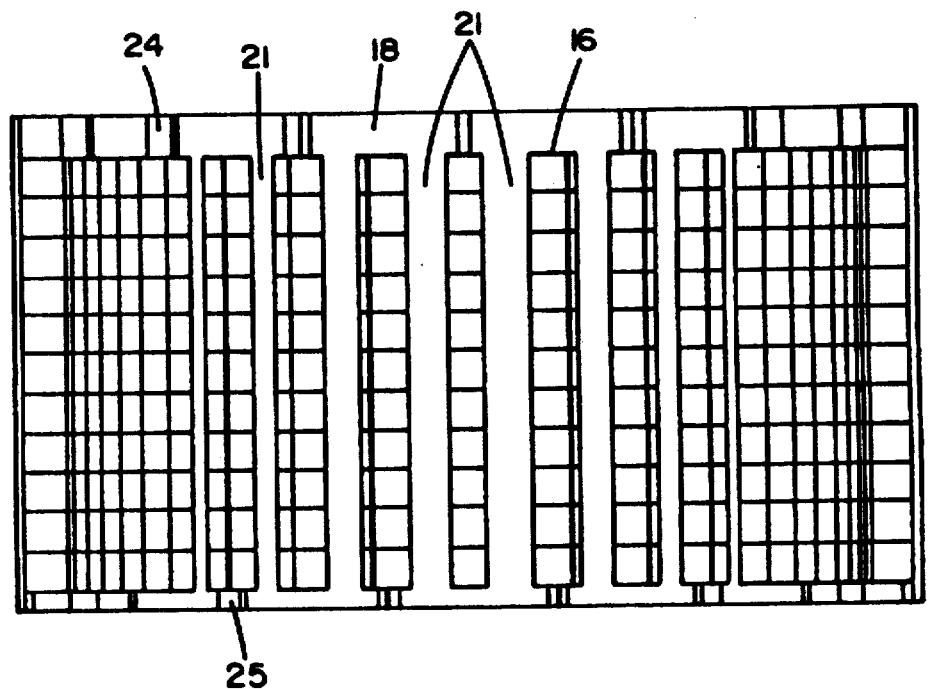
FIG. 5 is a view of the primary magnet array of the apparatus of FIGS. 1 to 4.

Above primary magnets 16 is an annular groove 19 and below them a corresponding annular groove 20. Grooves 19 and 20 communicate one with another via spaces 21 between adjacent primary magnets 16. The grooves 19 and 20 and the spaces 21 form channels for coolant fluid (e.g. water) by means of which the primary magnets 16 and body 15 can be cooled in use. Reference numerals 22 and 22a indicate coolant fluid supply and withdrawal conduits provided in annular member 23. Baffles 24, 25 are provided in grooves 19, 20, as can be seen in FIG. 5, in order to make the coolant fluid follow a predetermined path.

Figure 4:
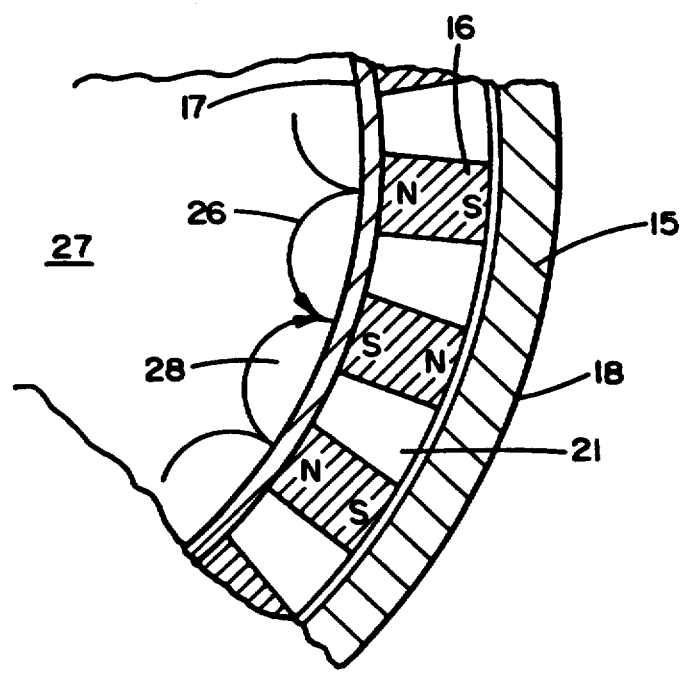
FIG. 4 is an enlarged view of part of FIG. 3.

FIG. 4 indicates the lines of magnetic force 26 produced by primary magnets 16. These lines of force extend from the inner surface of body 15 into cavity 27 in plasma chamber 5 and back into the wall of cavity 27 in an arch over regions 28 which extend parallel to the axis of body 5.

Figure 6:
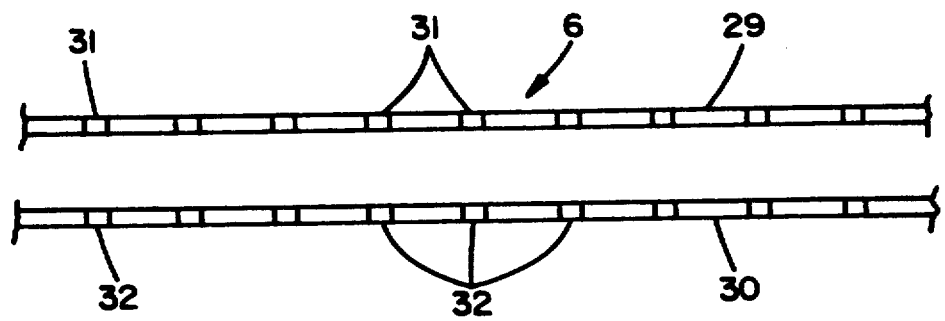
FIG. 6 is a vertical section on an enlarged scale through the control grid structure of the apparatus of FIGS. 1 to 5.
Figure 7:
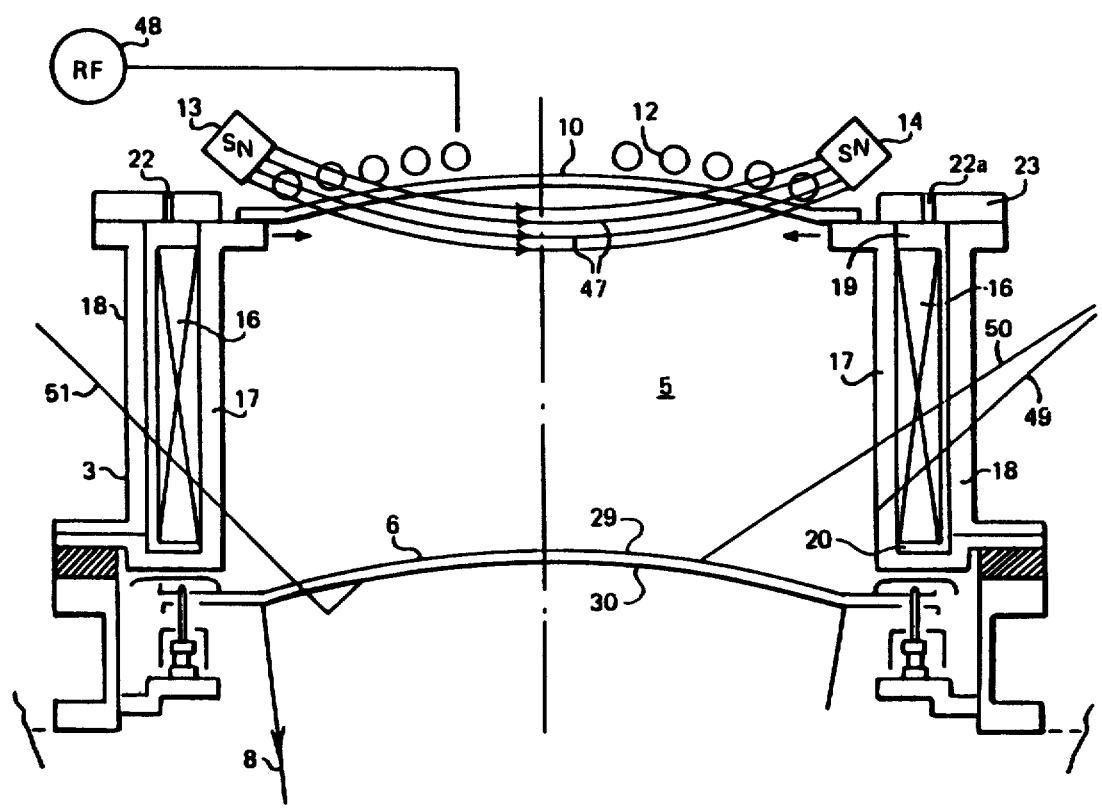
FIG. 7 illustrates the magnetic field produced by the secondary magnets of the ion gun shown in FIGS. 1 and 2.

Reverting to FIG. 1, the lower end of plasma chamber 5 is closed by a control grid structure 6 which is shown in more detail in FIG. 6 on a greatly enlarged scale. Grid structure 6 comprises two grids 29 and 30, each formed with aligned holes 31 and 32. Grid 29 is positively biased while grid 30 is negatively biased so as to set up an acceleration field between grids 29 and 30 to accelerate ions towards and through grid 30. Such grids can be manufactured from molybdenum or a molybdenum alloy or from carbon sheet. Typically grid 29 has a positive voltage of from 0 to about 1000 V applied to it, whilst a negative voltage of from 0 to about 2000 V is applied to grid 30.

Turning now to ion beam neutraliser 7, a gas, e.g. argon or oxygen, is supplied as indicated by arrow 33 through line 34 into a hollow insulated electrode assembly 35. The open end of electrode assembly 35 is closed by a pair of grids 36 and 37. An r.f. generator coil 38 surrounds electrode assembly 35. Conveniently this is driven at the same frequency as r.f. generator coil 12, e.g. 13.56 MHz. Grid 36 is negatively biased, while grid 37 is positively biased so as to set up an acceleration field between grids 36 and 37 to accelerate electrons towards and through grid 37.

Figure 2:
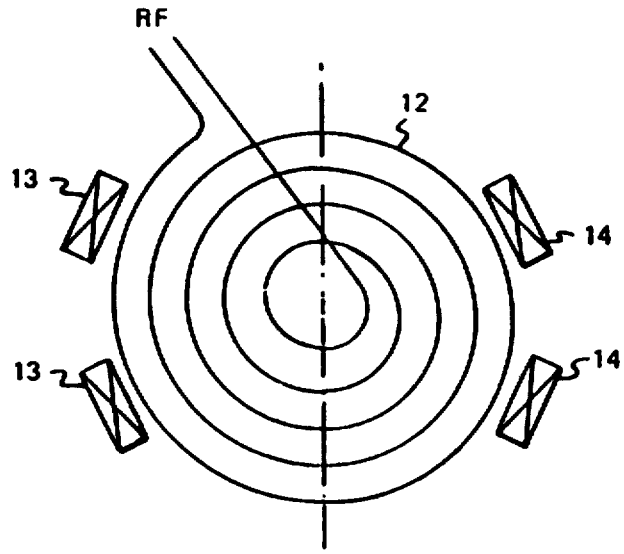
FIG. 2 is a plan view of the top of the ion gun of the apparatus of FIG. 1.

FIG. 2 illustrates in plan view the positions of the optional secondary magnets 13 and 14 relative to the r.f. generator coil 12. These secondary magnets produce a magnetic dipole field which penetrates the energizing coil 12. The shape of this magnetic field is shown diagrammatically in FIG. 7. As can be seen from FIG. 7 magnets 13 and 14 have their axes of magnetisation arranged so that either a north pole or a south pole faces the dielectric member 10 and so that the lines of force 47 penetrate the r.f. generator coil 12 and form an arch over the inner face of dielectric member 10.

Reference numeral 48 indicates an r.f. power source connected to coil 12; it can also be connected to coil 38. Alternatively coil 38 can have its own separate r.f. power source. Lines 49 and 50 indicates positive supply leads for electrode 17 and grid 29 respectively. Conveniently electrode 17 and grid 29 are at the same positive potential. Reference numeral 51 indicates a negative supply lead for providing the negative bias voltage on grid 30.

Vacuum chamber 2 can be evacuated by means of a suitable vacuum pumping system 52 connected via line 53 to vacuum chamber 2.

In use of ion beam processing apparatus 1 vacuum chamber 2 is evacuated to a pressure of typically about $10^{-5}$ millibar to about $10^{-7}$ millibar. A plasma forming gas, e.g. argon, a reactive gas, or a mixture of a plasma forming gas and a reactive gas, e.g. $O_2$, $Cl_2$, $SF_6$, $CF_4$, $C_2F_6$ or a $C_2F_6/CHF_3$ mixture is admitted via inlets 11. R.f. coil 12 is then excited to generate a plasma. This plasma has a plasma potential of at most a few tens of volts, for example about +10 volts above the voltage of the grid 29, which is normally at the same potential as the electrode 17. Electrons released are trapped within regions 28 by the magnetic lines of force 26. Grid 29 is biased to a positive voltage of about 100 V, while grid 30 is biased to a negative voltage of about 1000 V. The ions in the cavity 28 are accelerated towards and pass through grid 29 and are then further accelerated by the electric field between grid 29 and grid 30 to emerge in the form of a collimated ion beam 8 of defined energy. After passage through grid 30 ions in flight to the target 9, which is earthed, move in a decelerating field. The ions arrive at the earthed target 9 with an energy equal or approximately equal to the voltage of the first, positive grid 29 plus the sheath potential. Thus, if a bias of +100 v is applied to grid 29, which is immersed in the plasma, then the ions will arrive at the target 9 with a potential of about 110 v, irrespective of how high a negative voltage is applied to the second grid 30.

A plasma forming gas, such as argon, a reactive gas, or a mixture of a plasma forming gas and a reactive gas, is admitted to neutraliser 7 through tube 34 at a rate of from about 1 cm³ per minute to about 5 cm³ per minute, usually at the higher end of this range. The r.f. generator coil 38 is turned on to initiate electron discharge. Once electron discharge has started it can be maintained by use of a keeper potential of from about 20 V to about 40 V following reduction of the gas flow rate in tube 33 to about 1 cm³ per minute.

Under the influence of the r.f. signal from coil 12 the gas supplied via inlets 11 is dissociated to form a plasma of ions and free electrons in plasma chamber 5, the ions filling the central part of chamber 5 whilst the electrons are trapped adjacent the walls of chamber 5 by the magnetic lines of force 26. Because of the geometrical separation of the r.f. generating coil 12 from the zones 28 of the magnetic confinement region in plasma chamber 5 the plasma in the central part of chamber 5 is substantially uniform and has a relatively low plasma potential. This means in turn that a relatively low acceleration potential only is needed to extract ions from this plasma and to accelerate them towards and through control grid structure 6. Hence the risk of overheating of or damage to control grid structure 6, and particularly grid 29, is minimised.

Neutraliser 7 delivers a stream of electrons into the path of ion beam 8 and provides current neutralisation at the target 9.

As a heated cathode is not used to generate the plasma the illustrated apparatus can be used with any type of inert or reactive gas. Typical gases that can be used include argon, $O_2$, $Cl_2$, $SF_6$, $CF_4$, $C_2F_6$, $CHF_3$ and mixtures of two or more thereof.

As illustrated the ion beam processing apparatus 1 is set up for ion beam milling. It is a simple matter to modify the apparatus for sputter deposition; in this case a target replaces substrate 9 and is arranged so that it is struck by ion beam 8 at an oblique angle, while a target is placed in the path of the ensuing sputtered material but out of the path of the ion beam.

Figure 8:
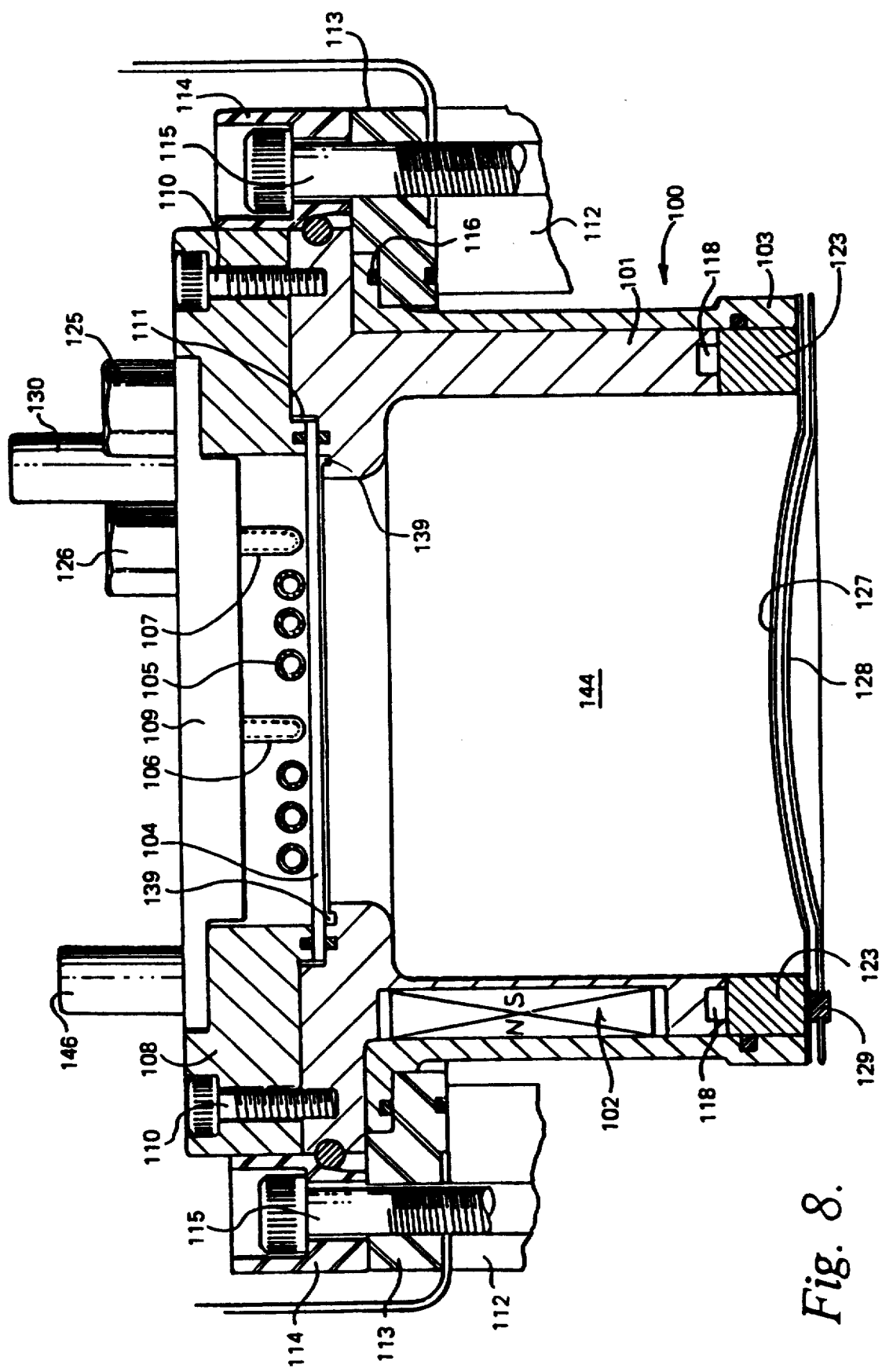
FIG. 8 is a vertical section through a second form of ion gun constructed according to the invention.

FIG. 8 is a vertical section through another form of ion gun 100 constructed in accordance with the invention. This comprises a body 101 made of austenitic stainless steel around which are mounted twenty bar magnets 102, symmetrically disposed about the periphery of ion gun 100. (There are fewer magnets in this embodiment than in that of FIGS. 1 to 7 because the diameter of body 101 is smaller than that of the ion gun of FIGS. 1 to 7). Typically the magnets 102 are rare earth magnets, such as samarium-cobalt magnets, with a field strength in the range of from about 1 kilogauss to about 2 kilogauss. As can be seen from FIG. 8, the magnetic axis of each magnet 102 is aligned so as to lie radially with respect to the axis of the ion gun 100 and to correspond to the shortest dimension of the magnet 102. The magnets 102 are arranged with alternating polarity around the periphery of ion gun 100 so that the magnets adjacent to the magnet shown in FIG. 8 have their north poles (not their south poles) facing towards the axis of ion gun 100, the next adjacent magnets to these have their south poles facing the axis of ion gun 100, and so on. A pole piece 103 made of soft iron or of a soft magnetic material surrounds body 101 and magnets 102.

Body 101 has an open upper end which is closed by a dielectric end plate 104 made of alumina. Alternatively it can be made of another dielectric material such as silica.

Above end plate 104 is an r.f. generator coil 105 in the form of a spirally wound copper tube having four complete turns. (For the sake of clarity the coils of r.f. generator coil are omitted in FIG. 9; however the construction of coil 105 is shown in more detail in FIGS. 17 to 19 as described further below). Water can be pumped through coil 105 to cool it. The end portions of coil 105 are indicated by means of reference numerals 106 and 107.

A top ring 108 holds end plate 104 in position and further provides support for a clamp 109 for coil 105. Top ring 108 is held in place by means of socket headed bolts 110. An O-ring 111 serves to provide a seal between end plate 104 and top ring 108.

Ion gun 100 is mounted in a vacuum chamber, similar to vacuum chamber 2 of the apparatus of FIGS. 1 to 8, which is designated by reference numeral 112 and is generally similar to vacuum chamber 2. In particular it is provided with connections to a vacuum pump (not shown) and is fitted with an ion beam neutraliser (not shown) and with a target (also not shown). The gun 100 is mounted to the body of the vacuum chamber 112 by means of a spacer 113, a clamp 114, and bolts 115. An O-ring 116 serves to provide a vacuum seal between pole piece 103 and spacer 113.

FIGS. 12 to 15 show the construction of body 101 in more detail. This has twenty slots 117 formed in its outer surface, each adapted to receive a corresponding bar magnet 102. At the lower end of body 101 there are machined a number of short grooves 118, five in all, which are evenly spaced around the periphery of body 101. There are also four grooves 119 at the upper end of body 101 but these are offset with respect to grooves 118. Vertical bores 120 connect grooves 118 and 119. Bores 121 and 122 provide an inlet and outlet passage to the tortuous path provided by grooves 118 and 119 and bores 120. As can be seen from FIG. 8 grooves 118 are closed by means of split ring 123 which is welded on the lower end of body 101, whilst insert plates 124 (shown in FIG. 13) are welded into the upper end of body 101 to close off grooves 119. In this way a closed passage for a coolant, such as water, is formed through body 101 which follows a tortuous path passing between adjacent pairs of magnets 102. Inlet and outlet connections 125 and 126 are provided to communicate with bores 121 and 122.

Body 101 carries at its lower end a control grid structure which includes a first grid 127 and a second grid 128. Grid 127 is bolted directly to body 101 and is in electrical contact therewith. Grid 128 is supported at three points around the periphery of body 101 by suitable insulator supports 129 (only one of which is shown). It is connected to terminal 130 by lead 131 which passes through an insulating pillar 132 and then through an insulating tube 133 mounted in bore 134 and which is electrically connected to grid 128 by means of a feedthrough 135 which passes through a spacer 136 positioned in a hole in grid 127. Nut 137 and washer 138 complete the connection to grid 128. With this arrangement grid 127 adopts the voltage of body 101, whilst grid 128 can be independently biased by applying a suitable negative voltage to terminal 130.

Figure 16:
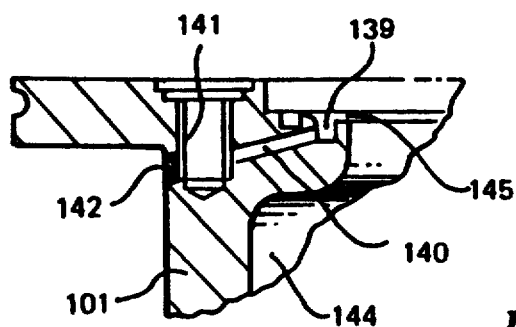
FIG. 16 is an enlarged section of part of the body of the ion gun of FIG. 8.

As can be seen from FIGS. 8, 10, 11 and 12, body 101 has a groove 139 positioned under the edge of dielectric member 104. This communicates by means of a transverse oblique bore 140 (see FIG. 16) with a further bore 141. Reference numeral 142 denotes a plug closing the outer end of bore 140. A connection 143 for a plasma gas supply (shown in FIG. 9) is screwed into bore 140. Such plasma gas can enter the plasma chamber 144 within body 101 by leakage from groove 139 through a clearance gap 145 (which is more clearly seen in FIG. 16) under dielectric member 104.

Figure 9:
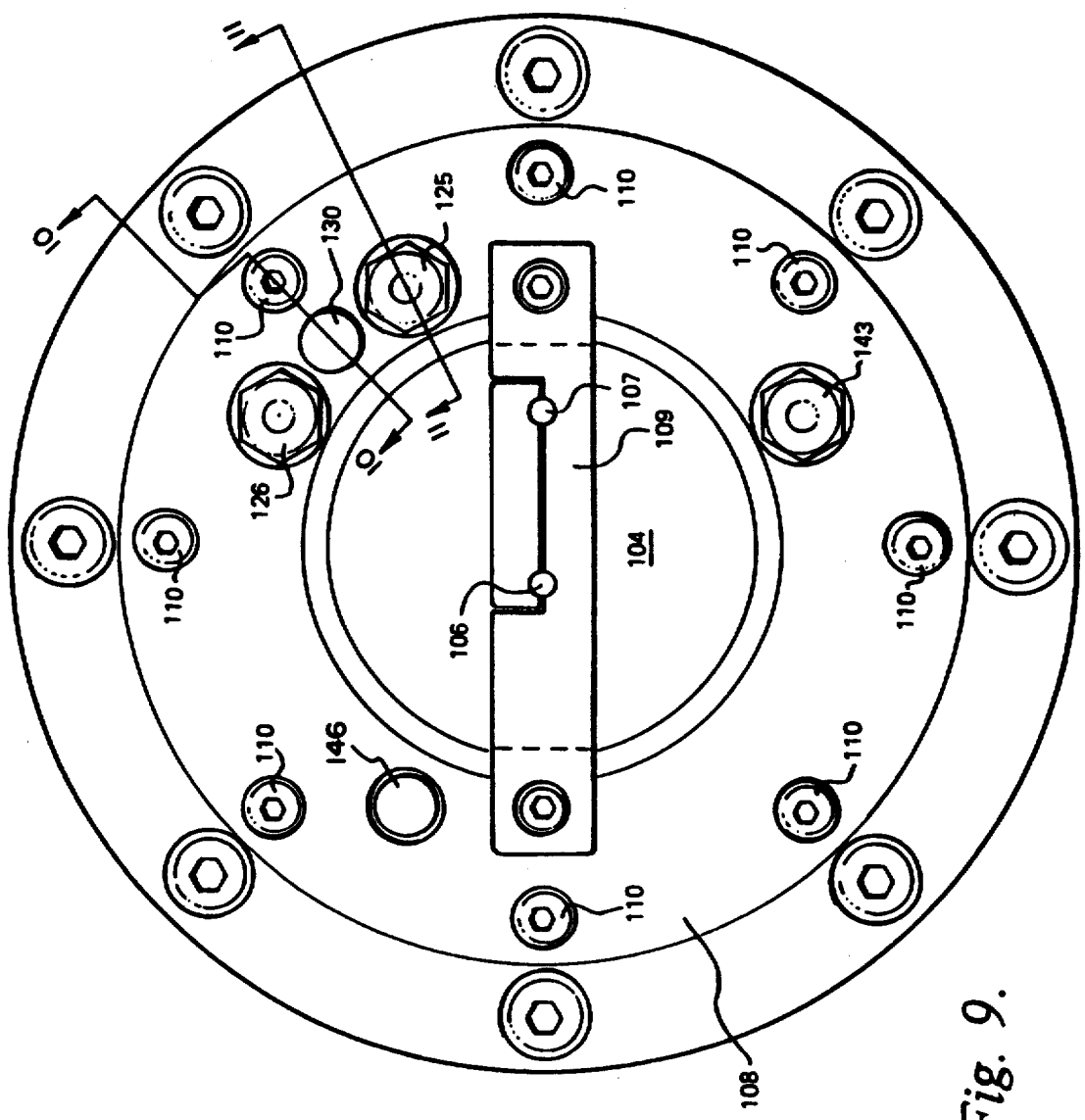
FIG. 9 is a top plan view of the ion gun of FIG. 8.
Figure 11:
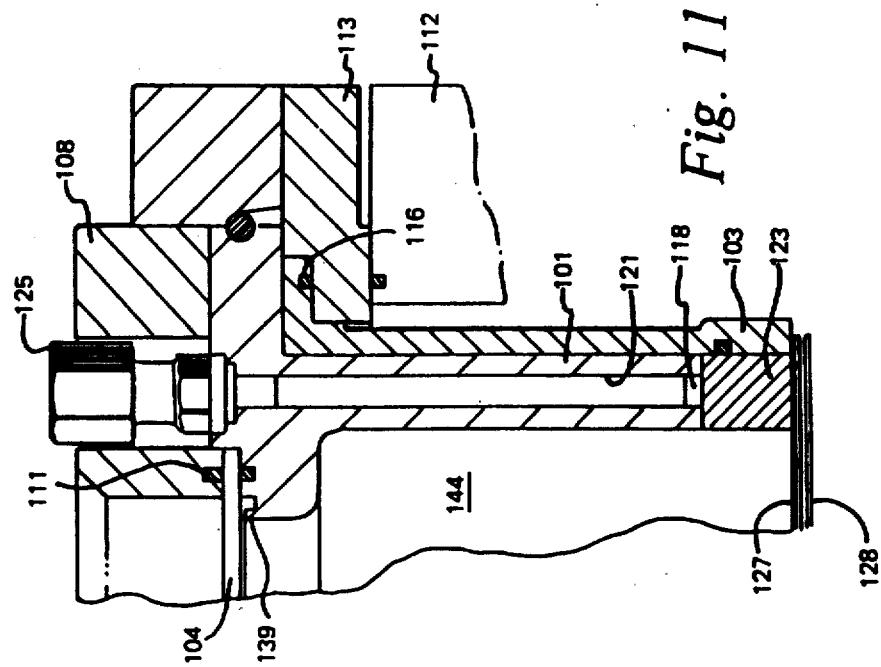
FIGS. 10 and 11 are sections on the lines A—A and B—B respectively of FIG. 9.
Figure 10:
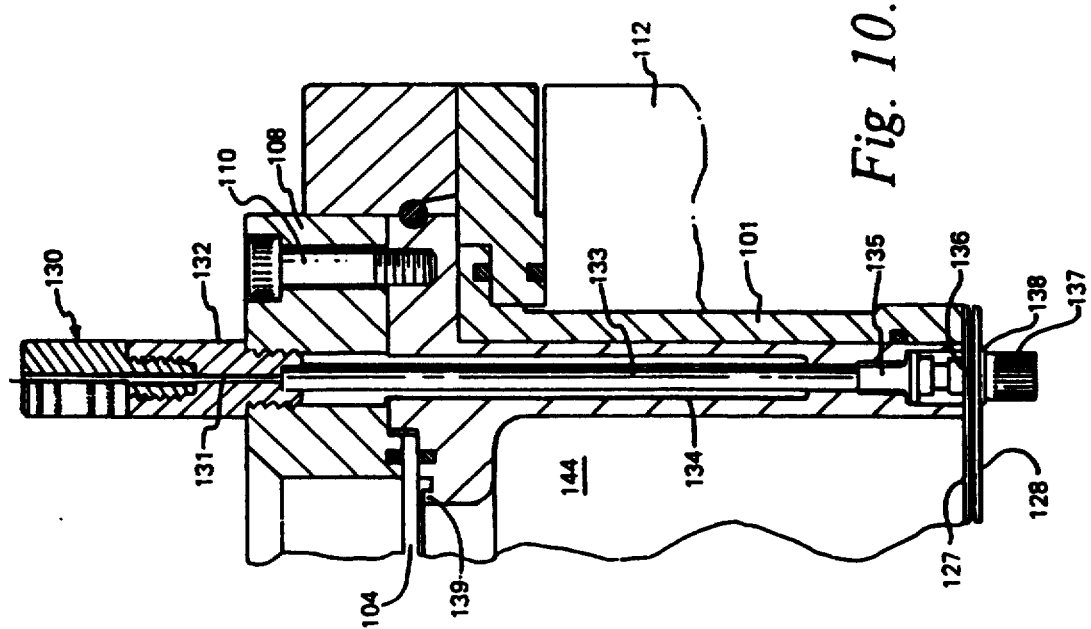
Figure 12:
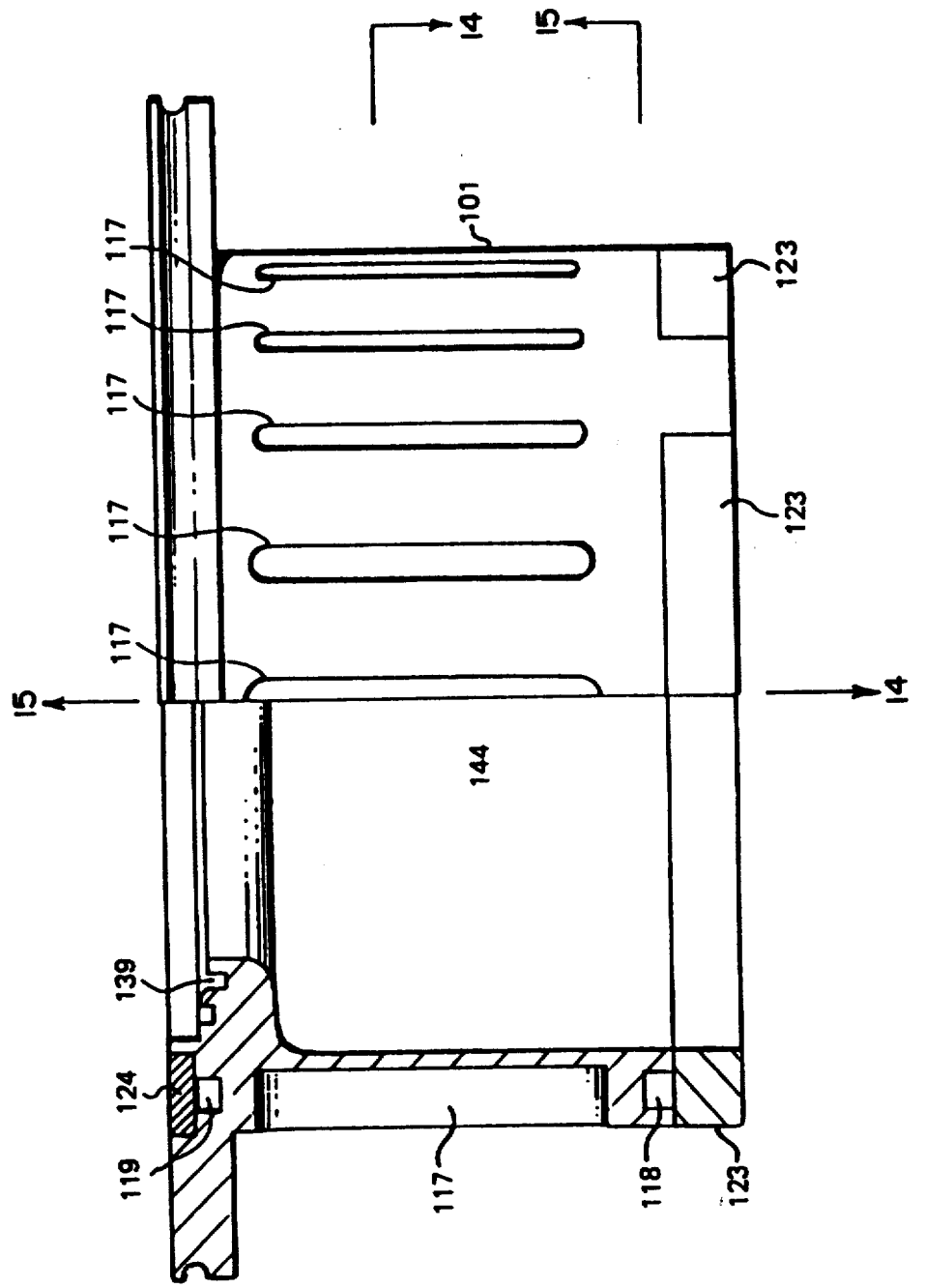
FIGS. 12 and 13 are a partly cut away side view and a top plan view respectively of the body of the ion gun of FIG. 8.
Figure 13:
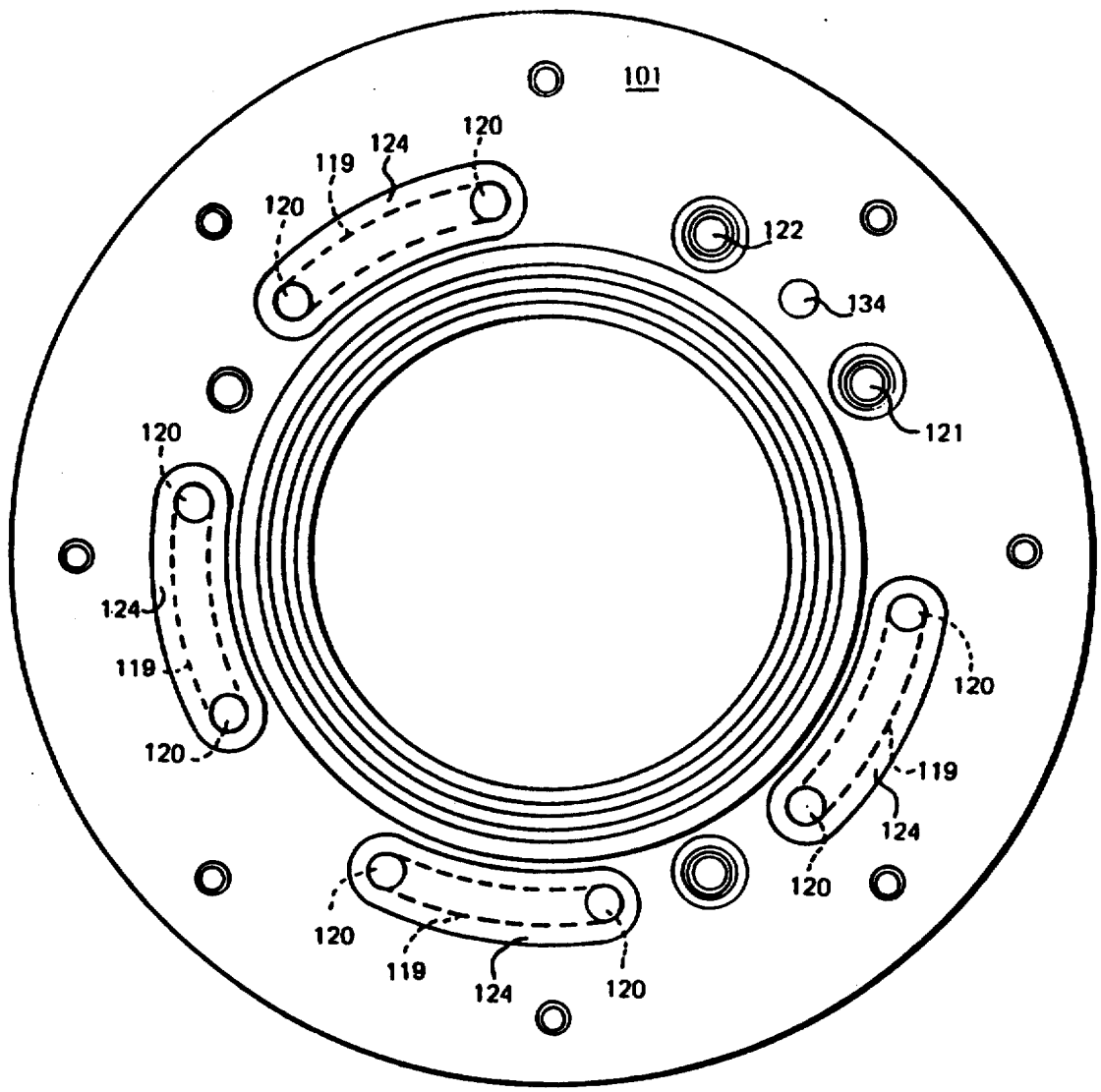
Figure 15:
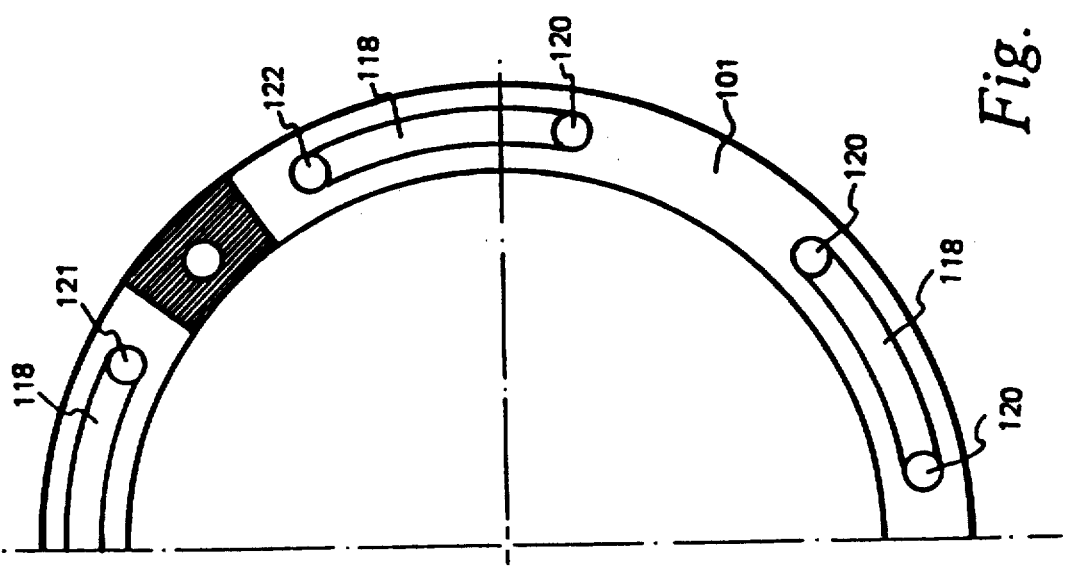
FIGS. 14 and 15 are sections on the lines C—C and D—D respectively of FIG. 12.
Figure 14:
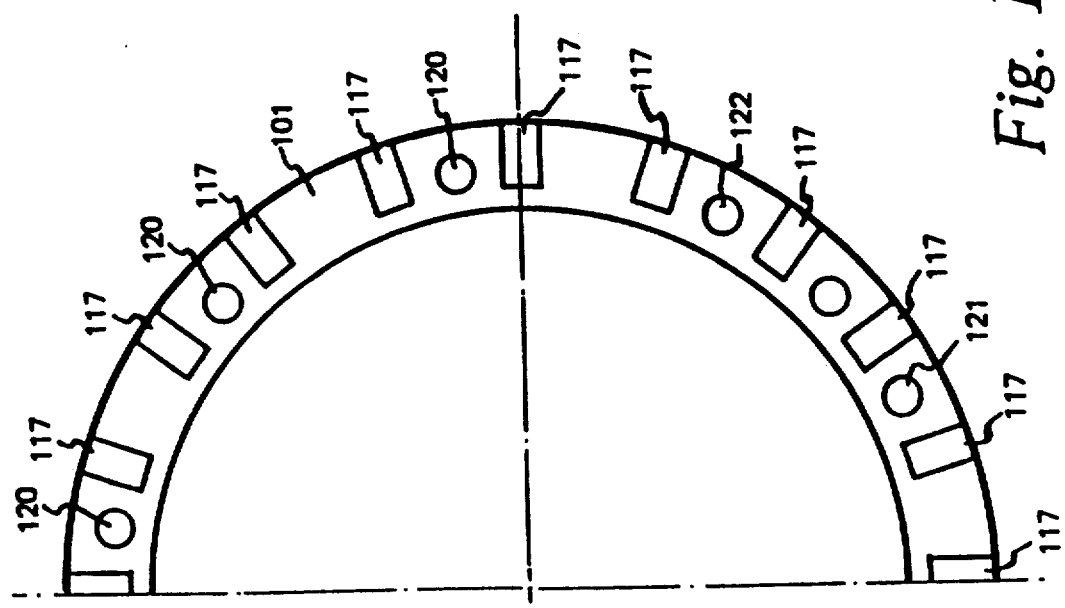

Reference numeral 146 in FIGS. 8 and 9 denotes a terminal by means of which a suitable voltage, usually a positive voltage, can be applied to body 101 and hence to grid 127.

Figure 19:
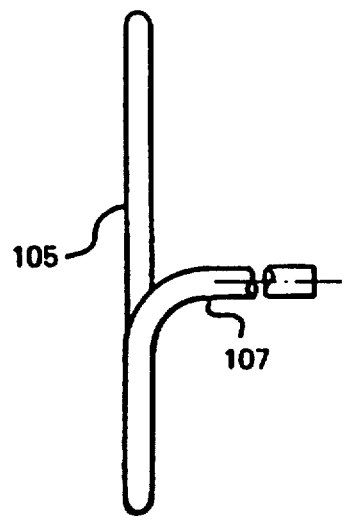
FIGS. 18 and 19 are respectively a section and a side view of the r.f. emitter coil.
Figure 17:
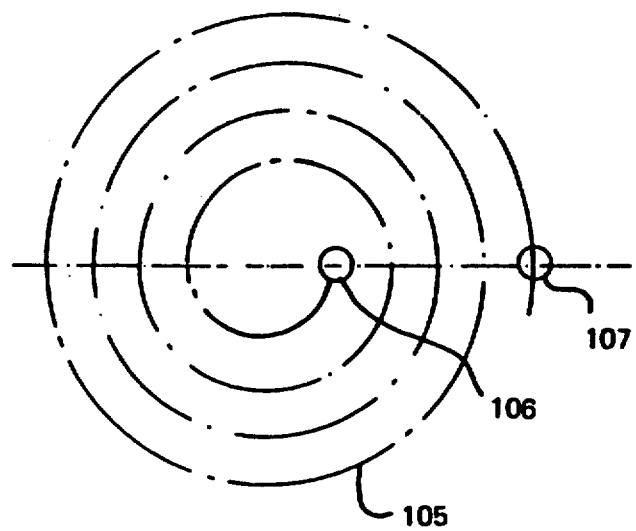
FIG. 17 is a schematic diagram of the axis of the tube from which the r.f. emitter coil is formed.
Figure 18:
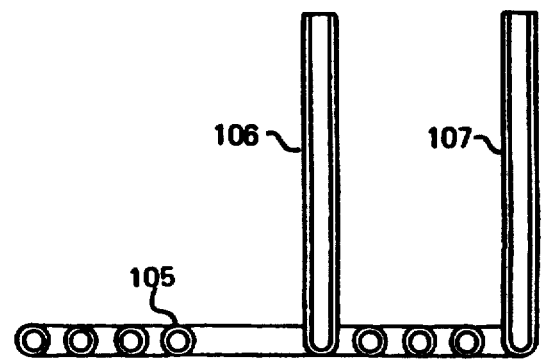

FIGS. 17 to 19 illustrate the construction of spiral r.f. coil 105 in greater detail. Only the axis of the tube of coil 105 is depicted in FIG. 17. The coil has 4 complete turns between portions 106 and 107.

In use of the ion gun of FIGS. 8 to 19 water is passed through coil 105 and through the tortuous path in body 101 by means of inlet 125 and outlet 126 and vacuum chamber 112 is evacuated to a suitably low pressure, e.g. $10^{-5}$ millibar to $10^{-7}$ millibar. Body 101 is biased to a suitable voltage, e.g. $+100$ v, whilst grid 128 is biased to, for example, $-500$ v. Plasma forming gas, such as argon or a mixture of argon and a reactive gas (e.g. oxygen), is then bled into vacuum chamber 112 via inlet 143 whilst maintaining a pressure in the range of from about $10^{-3}$ millibar to about $10^{-5}$ millibar Upon application of a suitable r.f. frequency, e.g. 13.56 MHz, to coil 105, a plasma is generated in plasma chamber 144. This typically equilibriates at a plasma potential of about 10 volts above that of body 101 and grid 127. Ions migrate by thermal diffusion, it is thought, to the vicinity of grid 127 and, upon passing through grid 127 are accelerated towards and through grid 128 by the electrical field caused by the potential difference between the two grids 127 and 128 (e.g. about 600 volts). After passage through grid 128 the ions travel on in vacuum chamber 112 towards a target (similar to target 9 of FIG. 1, but not shown) which is typically earthed. An ion beam neutraliser (not shown) similar to neutraliser 7 of FIG. 1 may be located within vacuum chamber 112. Grid 128 acts further to produce a deceleration field through which ions that have traversed grid 128 have to pass before hitting the target. In this way an ion beam with a suitable beam voltage, which is normally approximately the same voltage as that of the body 101 in the arrangement described, is produced.

It will be appreciated by those skilled in the art that the illustrated ion guns can be used in inert gas ion beam etching, in reactive ion beam etching, or in chemically assisted ion beam etching by suitable choice of the gas or gases supplied to the plasma chamber and to the ion beam neutraliser.

We claim:

1. An ion gun for use in ion beam processing comprising:
   a) a plasma chamber comprising:
      wall means defining an evacuable chamber having a first end and a second end; and
      a dielectric member extending across the first end of the evacuable chamber;
   b) gas inlet means for admission to the chamber of a plasma forming gas;
   c) radio frequency emitter means comprising a substantially flat spirally wound coil positioned adjacent to the plasma chamber for inductively generating a plasma in the gas in the plasma chamber during use of the ion gun;
   d) primary magnet means for trapping electrons adjacent the wall of the plasma chamber during use of the ion gun; and
   e) a control grid structure for extracting ions from plasma in the plasma chamber including a first grid arranged for connection to a positive voltage source and a second grid arranged for connection to ground or a negative voltage source so as to produce an acceleration field for accelerating ions towards and through the second grid of the control grid structure.

2. An ion gun according to claim 1, in which the dielectric member is flat.

3. An ion gun according to claim 1, in which the dielectric member is curved.

4. An ion gun according to claim 1, in which the coil is positioned adjacent to the dielectric member.

5. An ion gun according to claim 1, in which the coil is embedded within the dielectric member.

6. An ion gun according to claim 1, in which the coil is coupled to a power source operating at a frequency in the range of from about 1 MHz to about 40 MHz.

7. An ion gun according to claim 1, in which said wall means is constructed from an electrically conductive material.

8. An ion gun according to claim 1, in which said wall means is constructed from a dielectric material.

9. An ion gun according to claim 1, in which said primary magnet means comprises an array of magnets arranged to produce lines of magnetic flux within the plasma chamber which extend in a curve from the wall of the plasma chamber and return thereto so as to form an arch over a respective one of a plurality of wall regions of said plasma chamber.

10. An ion gun according to claim 9, in which said wall regions extend longitudinally of the wall of said plasma chamber.

11. An ion gun according to claim 9, in which said primary magnet means comprises an even number of magnets arranged in an array including at least one row extending around the periphery of said plasma chamber, with each magnet in said array being disposed with its magnetic axis extending substantially in a lateral plane and having a pole of opposite polarity to that of the magnets adjacent to it facing towards the plasma chamber.

12. An ion gun according to claim 11, in which the array of magnets comprises a plurality of rows of magnets extending around the periphery of said plasma chamber, with each magnet in a row having a pole of opposite polarity to that of any adjacent magnet in another adjacent row facing towards the plasma chamber.

13. An ion gun according to claim 1, further including a secondary magnet means positioned adjacent to the radio frequency emitter means for producing a magnetic dipole field that penetrates the coil of the radio frequency emitter means.

14. An ion beam processing apparatus comprising:
   1) a vacuum chamber;
   2) an ion gun utilizing radio frequency coupling for plasma generation and arranged to project an ion beam into the vacuum chamber;
   3) an ion beam neutralizer for projecting electrons into the ion beam; and
   4) a support for a target or a substrate in the path of the ion beam;
   the ion gun comprising:
   a) a plasma chamber comprising:
      wall means defining an evacuable chamber having a first end and a second end; and
      a dielectric member extending across the first end of the evacuable chamber;

b) gas inlet means for admission to the chamber of a plasma forming gas;

c) radio frequency emitter means comprising a substantially flat spirally wound coil positioned adjacent to the plasma chamber for inductively generating a plasma in the gas in the plasma chamber during use of the ion gun;

d) primary magnet means for trapping electrons adjacent the wall of the plasma chamber during use of the ion gun; and e) a control grid structure for extracting ions from plasma in the plasma chamber including a first grid arranged for connection to a positive voltage source and a second grid arranged for connection to ground or a negative voltage source so as to produce an acceleration field for accelerating ions towards and through the second grid of the control grid structure.

15. An ion beam processing apparatus according to claim 14, in which the ion beam neutralizer is coupled to a radio frequency power source.

16. An ion beam processing apparatus according to claim 14, in which the ion beam neutralizer comprises an open ended plasma source chamber, means for admitting a plasma forming gas to the plasma source chamber, a radio frequency generating coil surrounding the plasma source chamber for generating a plasma therein, and an extraction grid structure across the open end of the plasma source chamber including a first grid arranged for connection to a negative voltage source and a second grid arranged for connection to a positive voltage source so as to produce an acceleration field for accelerating electrons towards and through the second grid of the extraction grid structure.

17. An ion beam processing apparatus according to claim 14, in which the dielectric member is flat.

18. An ion beam processing apparatus according to claim 14, in which the dielectric member is curved.

19. An ion beam processing apparatus according to claim 14, in which the coil is positioned adjacent to the dielectric member.

20. An ion beam processing apparatus according to claim 14, in which the coil is embedded within the dielectric member.

21. An ion beam processing apparatus according to claim 14, in which the coil is coupled to a power source operating at a frequency in the range of from about 1 MHz to about 40 MHz.

22. An ion beam processing apparatus according to claim 14, in which said wall means is constructed from an electrically conductive material.

23. An ion beam processing apparatus according to claim 14, in which said wall means is constructed from a dielectric material.

24. An ion beam processing apparatus according to claim 14, in which said primary magnet means comprises an array of magnets arranged to produce lines of magnetic flux within the plasma chamber which extend in a curve from the wall of the plasma chamber and return thereto so as to form an arch over a respective one of a plurality of wall regions of said plasma chamber.

25. An ion beam processing apparatus according to claim 24, in which said wall regions extend longitudinally of the wall of said plasma chamber.

26. An ion beam processing apparatus according to claim 24, in which said primary magnet means comprises an even number of magnets arranged in an array including at least one row extending around the periphery of said plasma chamber, each magnet in said array being disposed with its magnetic axis extending substantially in a lateral plane and having a pole of opposite polarity to that of the magnets adjacent to it facing towards the plasma chamber.

27. An ion beam processing apparatus according to claim 26, in which the array of magnets comprises a plurality of rows of magnets extending around the periphery of said plasma chamber, with each magnet in a row having a pole of opposite polarity to that of any adjacent magnet in another adjacent row facing towards the plasma chamber.

28. An ion beam processing apparatus according to claim 14, further including a secondary magnet means positioned adjacent to the radio frequency emitter means for producing a magnetic dipole field that penetrates the coil of the radio frequency emitter means.

* * * * *

UNITED STATES PATENT AND TRADEMARK OFFICE
CERTIFICATE OF CORRECTION

PATENT NO. : 5,198,718
DATED : March 30, 1993
INVENTOR(S) : Mervyn H. Davis, et al.

It is certified that error appears in the above-identified patent and that said Letters Patent is hereby corrected as shown below:

Column 2, line 27: "tne" should read --the--
    Column 6, line 32: "electrodynanic" should read --electrodynamic--

Signed and Sealed this

Eighth Day of February, 1994

BRUCE LEHMAN

Attest:

Attesting Officer     Commissioner of Patents and Trademarks